US006927588B1

(12) United States Patent  (10) Patent No.: US 6,927,588 B1
Snelgrove  (45) Date of Patent: Aug. 9, 2005

(54) BALL ALIGNMENT PLATE TESTING APPARATUS AND METHOD FOR TESTING SEMICONDUCTOR CHIPS

(76) Inventor: Jeffrey David Snelgrove, 150 Lake Pl., Greer, SC (US) 29651

( * ) Notice: Subject to any disclaimer, the term of this patent is extended or adjusted under 35 U.S.C. 154(b) by 0 days.

(21) Appl. No.: 10/341,030

(22) Filed: Jan. 13, 2003

Related U.S. Application Data

(60) Provisional application No. 60/369,755, filed on Apr. 3, 2002.

(51) Int. Cl.[7] .............................................. G01R 31/02
(52) U.S. Cl. ..................... 324/755; 324/754; 324/158.1
(58) Field of Search ................................ 324/754–765; 439/66–91

(56) References Cited

U.S. PATENT DOCUMENTS

| | | | | |
|---|---|---|---|---|
| 5,232,372 A | * | 8/1993 | Bradley et al. ............... | 439/66 |
| 5,543,725 A | * | 8/1996 | Lim et al. .................... | 324/755 |
| 6,152,744 A | * | 11/2000 | Maeda ......................... | 439/71 |
| 6,208,156 B1 | * | 3/2001 | Hembree ..................... | 324/755 |
| 6,313,651 B1 | * | 11/2001 | Hembree et al. ........... | 324/755 |
| 6,369,595 B1 | * | 4/2002 | Farnworth et al. .......... | 324/755 |
| 6,380,492 B1 | | 4/2002 | Yoshioka ..................... | 174/256 |
| 6,394,820 B1 | | 5/2002 | Palaniappa et al. .......... | 439/83 |
| 6,402,528 B2 | | 6/2002 | Takahashi et al. ............ | 439/70 |
| 6,416,332 B1 | | 7/2002 | Carron et al. ................. | 439/70 |
| 6,677,770 B2 | * | 1/2004 | Frankowsky ................. | 324/755 |

* cited by examiner

Primary Examiner—Paresh Patel
(74) Attorney, Agent, or Firm—McNair Law Firm, P.A.

(57) ABSTRACT

There is disclosed an assembly for use in testing ball grid array devices, the assembly including a novel ball alignment plate. The ball alignment plate is a thin material having a pattern of holes precisely formed therethrough. The pattern of holes is formed to match the array pattern of the ball grid array. Use of the plate enables the quick and accurate positioning of a ball grid array device with respect to a testing circuit, and enables the use of a test assembly that can easily be adapted for use with different devices.

27 Claims, 6 Drawing Sheets

US 6,927,588 B1

BALL ALIGNMENT PLATE TESTING APPARATUS AND METHOD FOR TESTING SEMICONDUCTOR CHIPS

This application claims the benefit of a provisional patent application Ser. No. 60/369,755, entitled "Ball Alignment Plate" filed Apr. 3, 2002.

FIELD OF THE INVENTION

The current invention relates generally to an apparatus and method for testing semiconductor chips, and more specifically relates to an apparatus and method for reducing automated quality control rejection of chips due to inconsequential physical variances in chips.

BACKGROUND OF THE INVENTION

Semiconductor chips, including by way of exemplification only memory chips, are typically produced en masse by creating an array of chips on a single, relatively large, wafer made of suitable semiconductor material. The chips are created through techniques involving masking and etching as are known in the art. After the chips are created through these processes, or during such creation, leads are added to the chip such that the chip and its components can be electrically connected to other devices. After the chips have been created on the larger wafer, the wafer is cut to produce the individual chips.

Currently, the leads used for chips, and especially for high-speed chips, are balls connected in an array to one side, referred to as the bottom, of the chip. The balls consist of a eutectic metal compound similar to a soldering compound. Devices such as these are commonly referred to as ball grid array (BGA) devices. Such ball grid array devices can be placed on a substrate such as a larger circuit board, with the ball grid array of the chip aligned with the appropriate connectors of the substrate. Application of heat melts the balls sufficiently to form a secure electrical contact between the electrical elements on the chip and the electrical connections on the substrate.

In the industry, it has been determined that it is less expensive to test each chip after the chips are cut from the larger wafer. This way, a defective chip is detected before it is integrated into a larger circuit, or is shipped to a buyer for the buyer's uses. This is especially true because chips are usually sold in large quantities. If a defective chip or circuit is found, the buyer typically returns an entire shipment rather than conducting its own testing to determine which chips are satisfactory and which are not. Therefore, quality control procedures to test each individual chip prior to shipping or further integration are very important.

A typical testing apparatus for testing chips consists of a test circuit board or substrate having at least one set of electrical connections arrayed in a test circuit pattern that matches the ball grid array pattern of the chip. For testing purposes, a substrate may have tens or hundreds of such test circuit arrays to permit the testing of an equal number of chips. A casement or fixture is mounted to the substrate. The casement is typically a plastic device having an opening there through, and is typically provided with a cover. The cover is connected to the casing via a hinge. The opening of the casing is sized such that a properly cut chip will fit exactly within the opening, and is often sized such that some force is required to securely seat the chip within the opening. The opening is also created such that a chip seated within the opening will be aligned such that the ball grid array of the chip is appropriately aligned with the connectors in the substrate. The chip is seated within the casing and the cover is closed, thereby forcing the chip downward toward the substrate such that a secure electrical connection is created between the ball grid array and the substrate. The substrate can then be used to test the components and/or operation of the chip.

A major problem with the foregoing method of testing chips is caused by misalignment of the ball grid array with the connectors in the substrate. Due to the very small size of the typical chip, very minor errors in positioning the chip with respect to the substrate can cause a misalignment of the ball grid array with the substrate connectors. A large number of chips rejected due to failure of the testing process fail not because the chip itself is faulty, but because the alignment, and hence the testing, was in error.

The misalignment is most often caused by the cutting process. As chips are cut from the wafer, the saws used to cut the chips are subject to relatively high cutting temperatures. The saws also wear during the process because of the hardness of the semiconductor material. A significant number of chips in each wafer therefore have length and/or width dimensions that differ, albeit slightly, from what is desired. Upon testing, these chips may not fit correctly within the opening in the casings. If the dimensional error is great enough that the chip cannot be forced into the opening, the chip will be rejected even if it is electrically satisfactory. If the chip can be forced into the opening, the slight dimensional variation may prevent the ball grid array from aligning properly with the electrical connections on the substrate. Such a chip will fail the electrical test and be rejected, even if the only fault is a slight dimensional variation having no effect on the proper operation of the chip.

Attempts have been made to improve various aspects of the problem of accurately aligning a ball grid array with the substrate or circuit to which a BGA device is connected for testing or for assembly of a larger device. These attempts typically involve complicated and expensive devices. U.S. Pat. No. 6,380,492 to Yoshioka, for example, discloses a contact film for making electrical contact with the balls of a BGA device. This patent discloses a multi-layer plastic laminate, the individual layers of the laminate having holes therein and the layers being assembled so as to form a grid pattern of holes. Each layer in the laminate has electrical leads terminating at selected holes. When the layers are laminated together, the holes in each layer coincide with those in other layers. A BGA device is forced down onto the laminate, and the device can be tested by activating the various electrical leads on each layer. The laminate can be constructed to allow the simultaneous testing of a plurality of BGA devices. As disclosed in this patent, however, the laminate requires creating the various leads on each layer and laminating the layers together to achieve the appropriate patterns. For each different type of BGA device to be tested, an entirely new set of layers must be manufactured and carefully assembled.

In U.S. Pat. No. 6,416,332 to Carron et al. there is disclosed another type of socket for connecting a BGA device to a larger circuit board or other device for testing or manufacture. This patent discloses using an array of resilient conductive pads arranged to complement the array of the BGA device. The pads enable the electrical connection between the BGA device and the electrical connections in the underlying substrate or circuit. This apparatus requires the manufacture of pads that have been specifically manufactured for each different type of BGA device, and require the pad to have discrete conductive contacts for each ball of the BGA device. This requires that the pads be precisely manufactured to ensure that the conductive contacts are operative. The pads require precise, multistep manufacturing to provide the resilient conductive leads disclosed in this patent.

In U.S. Pat. No. 6,394,820 to Palaniappa et al. there is disclosed an assembly and mounting apparatus useful for BGA devices. This apparatus, however, utilizes an array of pins, and is directed to the problem of ensuring a secure electrical contact between the BGA device being tested and the substrate or circuit board. Again, the device is relatively complicated, having numerous very small parts that are subject to misalignment. Furthermore, such devices as pins can very easily be damaged, and damage to a very few pins in the array can destroy the usefulness of the entire device.

There is a need in the industry to provide a means of effectively testing BGA devices with relatively inexpensive apparatus that eliminates the need for replacing expensive testing equipment while simultaneously reducing the rate of rejection of BGA devices for physical variations not affecting the functionality of the devices.

SUMMARY OF THE INVENTION

It is an object of the current invention to present a solution to the foregoing problems.

It is also an object of this invention to present a relatively inexpensive but effective means of allowing BGA devices to be validly tested while substantially decreasing the number of devices rejected due to minor physical variations.

It is also an object of this invention to provide a means of continuing to utilize printed circuit boards and casements similar to those currently used to test BGA devices while also providing a means to inexpensively adapt such casements to use with different BGA devices.

These and other objects of the invention are obtained by providing a testing assembly for testing an electronic ball grid array (BGA) device having an electrical ball connector pattern corresponding to a test connector pattern of a test circuit formed on a test circuit board. The test assembly includes a conductive connector pad overlying the test circuit having a thickness defined by an upper conductive surface and a lower conductive surface. The connector pad is composed of conductive material so that the connector pad is conductive across its entire thickness. A test casement is secured to the circuit board in a test position above the connector pad and the test circuit. A thin ball alignment plate is carried by the casement overlying the connector pad and test circuit having a ball hole pattern corresponding to the ball connector pattern of the BGA device. The test casement includes a casement opening through which the ball alignment plate is exposed overlying the connector pad and test circuit. A releasable retainer is carried by the test casement for retaining the BGA device on the test casement so that the ball connector pattern of the BGA device is retained in alignment with the ball hole pattern of the ball alignment plate for testing whereby the BGA device circuit is aligned in electrical connection with the test circuit for reliable testing of the BGA device. Advantageously, the casement includes a peripheral inner wall defining a casement opening, having an area greater than outer dimensions of the BGA device so that the BGA device may be moved sufficiently within the casement opening to align with the hole pattern of the ball alignment plate regardless of variations in the outer dimensions of the BGA device. The test casement includes an underside facing the connector pad, and a recess formed in the underside for receiving the ball alignment plate. The connector pad can also be advantageously retained in the recess with the alignment plate. In one aspect of the invention, the ball alignment plate includes a thin plate of elastomeric material with the ball hole pattern including a plurality of holes formed through the elastomeric material. In another embodiment, the ball alignment plate may comprise a sheet of non-static high glass plastic with the ball hole pattern including a plurality holes formed through the plastic material. The ball alignment plate preferably has a thickness of from about 0.001 to about 0.03 inches depending on the size of the BGA device and diameter of its connector balls. The ball hole pattern may correspond to the connector ball array of the BGA device, or be generic so the array of holes accommodates BGA devices generally of the same type having variations of connector ball patterns. In the latter case a positioning device, such as a robot, may be used to assure the BGA device is correctly positioned in holes aligned with the test circuit connector. The retainer may include a retainer element spanning the casement opening having a pressure pad pressing the BGA device against the ball alignment plate thereby pressing the ball connector pattern against the conductor pad and test circuit. In one embodiment, the retainer element may include a spring clamp pivotally connected to the casement on one side of the opening and releaseably connected to the casement on an opposite side of the opening, the pressure pad including a horizontal pressure plate carried between the pivotal end and releaseable end of the spring clamp.

In a highly advantageous aspect of the invention, a ball alignment plate of thin compressible material having a hole pattern formed through the alignment plate matching the ball connector pattern of the BGA device is provided as a reliable tool for aligning BGA devices in a test assembly. The ball alignment plate is positioned adjacent the test circuit board when held by the test casement so that the hole pattern is aligned with the test connector pattern of the test circuit. The hole pattern facilitates accurate alignment of the ball connector pattern of the BGA device and the test connector pattern of the test circuit so that the BGA device is electrically aligned with the test circuit and the connector pad permits electrical contact between the BGA device and the test circuit board for reliable testing of the BGA device. The BGA device dimensions do not have to exactly fit the casement opening. By making the casement opening larger than the BGA device, the BGA device may be maneuvered in the opening to fit within the hole pattern of the ball alignment plate regardless of dimension variations in the BGA device. The casement opening can be slightly larger, or substantially larger, than the BGA device dimensions depending on the size of the BGA device and the size of the connector balls in the array.

An advantageous aspect of the invention is a method of testing the electronic circuit of a ball grid array (BGA) device having a ball contacts arranged in a ball connector pattern, said method being of the type wherein the BGA device is placed in a casement secured to a circuit board having a test circuit and the casement includes a casement opening fixed directly over the test circuit to automatically align the ball contacts of the BGA device electrically with the connectors contacts of a test circuit disposed below the BGA device, wherein the method comprises providing a test casement having a casement opening with inner dimensions slightly greater that the outer dimensions of said BGA device; and fixing said test casement to the test circuit board directly over the test circuit. Next, the method includes fixing a thin ball alignment plate on the casement wherein the ball alignment plate has a plurality of holes arranged in a hole pattern matching the ball connector pattern of the BGA device and the test connector pattern of the test circuit. The method includes placing. The BGA device within the casement opening and atop the ball alignment plate; and maneuvering the BGA device over the ball alignment plate within the casement opening until said ball connectors align and fit within the holes of said ball alignment plate whereby BGA devices may be reliably electrically aligned with the test circuit regardless of variations in the outer dimensions of said BGA devices. Another aspect of the method is retaining said ball alignment plate in a bottom recess formed in the base of said test casement facing the test circuit by using a retaining element spanning said casement opening having a lower pressure plate bearing against said BGA device.

DESCRIPTION OF THE DRAWINGS

The construction designed to carry out the invention will hereinafter be described, together with other features thereof, including references to the following drawings in which.

DETAILED DESCRIPTION OF THE INVENTION

Figure 1:
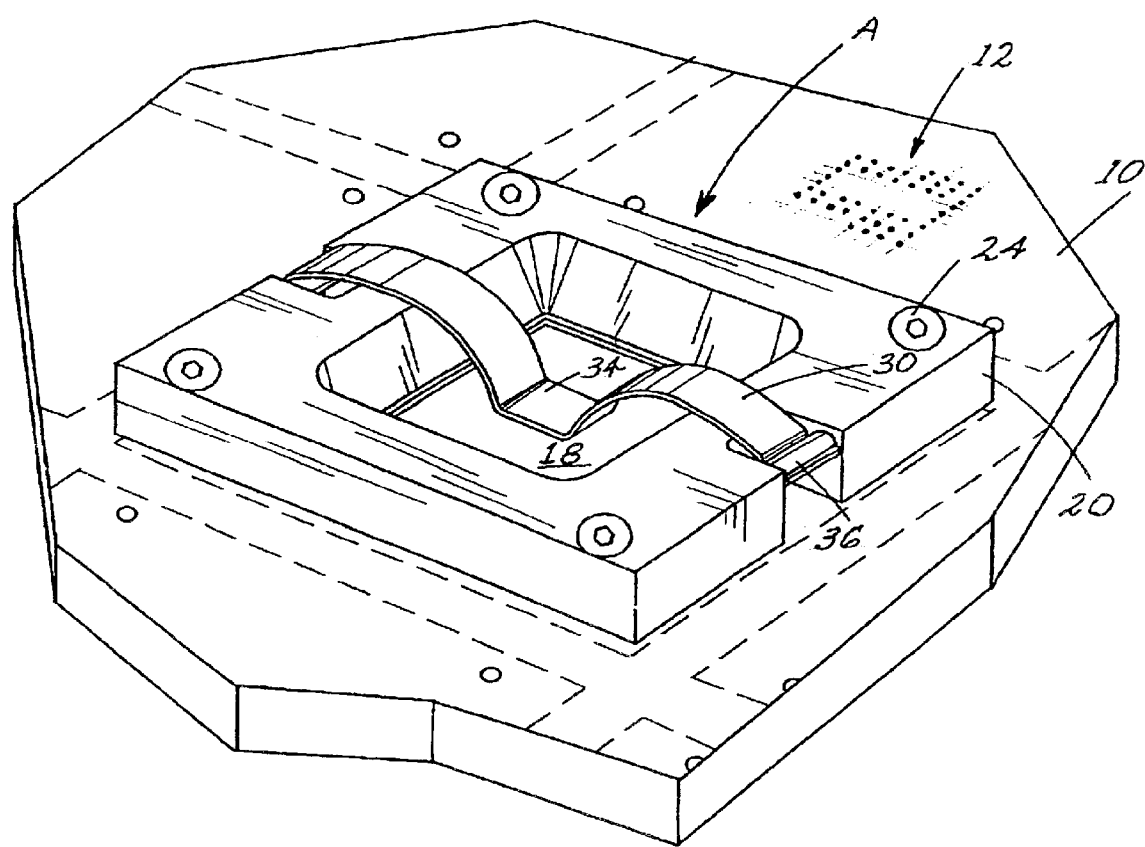
FIG. 1 is a top plan perspective view of an apparatus according to one aspect of the current invention.

Referring to the drawings, the invention will now be described in more detail. As can best be seen in FIGS. 1 and 2 in assembled and exploded versions respectively, a testing assembly, designated generally as A, is illustrated which includes a printed circuit board (PCB) 10, sometimes referred to as a DUT board having a plurality of individual test circuits, such as 12, printed or carried thereon. Each test circuit has exposed connectors 12a for making contact with the balls of a BGA device to be tested, the electrical connectors being arrayed in pattern complementary to the pattern of the array on the BGA device. The assembly includes a conductive connector pad 14 overlying the printed circuit 12. Connector pad 14 is preferably a resilient film capable of conducting current between a ball of the ball grid array and the exposed conductor of test circuit 12. Examples of connector pad 14 are commercially available and are referred to as MT pads. These essentially consist of a plurality of fine conductive wires vertically matrixed in a resilient elastomer, which enables point connections to be made while preventing undesired cross connections between balls in a ball grid array or the connectors to which the balls connect.

According to an advantageous aspect of the invention, a novel ball alignment plate B is disposed atop connector pad 14. Ball alignment plate B includes a plurality of openings or holes 52 arranged in an array corresponding to the array of balls 50 on a ball grid array (BGA) device 18. For this purpose, ball alignment plate B is comprised of non-conductive material. However, the balls of the ball grid array device are able to extend through the holes 52 and make contact with upper surface 14a of conductive connector pad 14 and hence with connectors 12a of a test circuit 12.

It has been found, contrary to what was accepted in the industry, that ball alignment plate B can be machined from suitable material with a very high degree of precision. The precision is such that a pattern of holes can be cut into an alignment plate B, the pattern precisely matching the array pattern of balls on a BGA device. The ball alignment plate B therefore can serve to exactly position the balls of a BGA device with respect to the connectors of a test circuit, or other device, such that a secure electrical contact will be made between the test circuit and the BGA device. The preferred material for a ball alignment plate according to the current invention is a nonconductive, relatively rigid sheet of preferably high-glass plastic. An example of such material is a G10FR4 high glass phenolic. The sheet of material from which the ball alignment plate is made should be relatively thin, such that the plate has sufficient thickness to enable fixed, accurate positioning of the ball grid array of a BGA device while permitting the balls of the array to protrude through the pattern of holes formed in the plate for electrical contact. While maintaining relative rigidity, the material of the plate is also preferably somewhat resilient to provide at least some cushioning effect when a BGA device is pressed downwardly upon the plate. A preferred thickness for this plate is from 0.001 to 0.03 inches (0.0254 to 0.762 mm). It has been found, according to the invention, that a plate thickness in this range is effective to align the connector balls reliably, and allow electrical contact with the test connectors. The thickness also provides sufficient plate body weight to accommodate known BGA device sizes. For example, thicknesses smaller than 0.001 have been found lacking in structure to both accurately align and make ball connections. Thicknesses larger than 0.030 may not allow reliable electrical connection. In general, the plate thickness, hole size and ball diameter are functionally related in regard to the ball alignment plate. The plate holes must be sized to allow the ball to penetrate for contact but must also retain the ball tightly in the hole for alignment. For example, if the holes were large, penetration and contact may occur but too much play effects proper alignment.

Three examples of ball diameter and corresponding plate thickness, along with other constant parameters, are shown below:

| | | | |
|---|---|---|---|
| CSP Ball Diameter (mm) | 0.30 | 0.45 | 0.60 |
| Thickness MT Connector (mm) | 0.50 | 0.50 | 0.50 |
| Recommended Compression | 20.000% | 20.000% | 20.000% |
| Linear Coefficient | 2.867E+03 | 2.867E+03 | 2.867E+03 |
| Linear Offset | −73.40 | −73.40 | −73.40 |
| No Balls On Package | 66 | 66 | 66 |
| Ball Alignment Plate Thickness (mm) | 0.08 | 0.18 | 0.30 |

As will be described below, ball alignment plate B is positioned atop and adjacent the connector pad 14. Plate B is also positioned such that the pattern of holes 52 therein is precisely positioned with respect to test circuit 12. With correct positioning, the hole pattern in ball alignment plate B precisely overlies the pattern of exposed connectors in test circuit 12.

Connector 14 pad may be any suitable elastomeric conductive pad, such as a MT-connector pad. Typically these types of connector pads have a multitude of conductive vertical wires extending between the thickness of the pad defined by its opposing surfaces so that the entire paid is conductive. The pad makes an electrical connection between the balls of the ball grid array and the printed circuit below.

Referring again to FIGS. 1, 2, and 4, the assembly includes a fixture in the form of a casement 20 having a recess 22 on its back side in which the ball alignment plate fits tightly. Casement 20 can also be made of any suitable material. It is preferably made of a plastic to provide both nonconducitivity and sufficient rigidity. The casement 20 with ball alignment plate B fitted into recess 22 is placed over connector pad 14 Locating pins 21 of the casement fit into locating holes 10a of the circuit board for proper placement. The casement is then secured to the DUT board by any suitable means, such as screw fasteners 24. Fasteners 24 should be selected such that casement 20 and other parts of assembly A are securely held to DUT board 10 during testing and other operations, but are preferably removable. Ball alignment plate B is used in testing the ball grid array devices 18. It has been found that a relatively thin, relatively rigid sheet of appropriate material can be precisely machined with a pattern of holes complementary to the ball grid array pattern of a ball grid array (BGA) device.

In one aspect of the invention, ball alignment plate B is positioned adjacent connector pad 14 such that the pattern of holes through the plate is aligned with the electrical connectors 12a of a test circuit 12. The pattern of holes 16 in the ball alignment B plate functions to mechanically position the ball grid array of the BGA device 20 in precise alignment with the connectors of the substrate, thus ensuring good electrical contact between the BGA device and the substrate to allow testing.

The ball alignment plate permits use of a casement 20 having a casement opening 26, defined by inner peripheral frame wall 27, that is somewhat larger than chip to be tested, that is, it is not necessary to use the casement 20 as the positioning element to align the chip vis-a-vis the substrate. Instead, the opening in the casement 20 simply provides a holder for the chip, while aligning the ball grid array of BGA device 18 with the substrate connectors is accomplished by the ball alignment plate B. It will still be desirable in most instances to have a cover or other device that will exert a firm downward pressure on the chip. For these purposes, the inner dimensions of the casement opening are slightly greater than the outer dimensions of the BGA device.

One means of firmly securing a BGA device 18 in a casement 20 is shown in the figures as a retainer in the form of a spring clip 30. As shown in the assembled form in FIG. 1, spring clip 30 is mounted on casement 20. In this illustrative embodiment, spring clip 30 consists of two arcuate spring portions 32a and 32b connected in the middle by a flat pressure pad or plate 34. Spring clip 30 is sized such that when the clip 30 is in use, the bottom portion of flat plate 34 will apply pressure to BGA device 18 in opening 26 of casement 20. Spring clip 30 can be made of any suitable material, and a thin spring steel is the preferred material. Flat pressure plate 34 can be sized to have about the same surface area of the BGA device to be tested so as to apply pressure evenly to the entire device. The bottom portion of flat plate 34 that contacts the top of the BGA device can have a coating or layer (not shown) to provide a suitable friction grip and/or to provide a resilient pad to help protect the BGA device.

Figure 5:
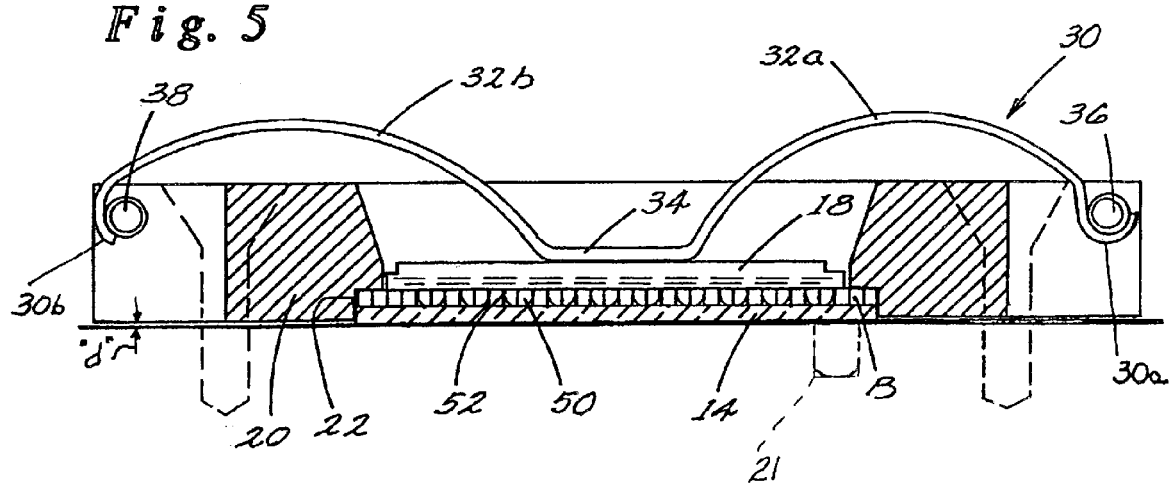
FIG. 5 is a cross-sectional view of the assembly of FIG. 1 along the line Y–Y'.

The spring clip 30 can be attached to casement 20 via a latch or pivot element 36. This keeps spring clip 30 attached to casement 20 while allowing the clip 30 to be snapped out of the way while a BGA device is removed from or inserted into the opening of casement 20. The other end of clip 30 can be removably secured by, for example, a pin 38 in casement 20. This arrangement provides a simple means for securing a BGA device in casement 20 while applying sufficient pressure to the BGA device to ensure a good electrical connection between the ball grid array and the connections in test circuit 12. Clip 30 can be easily fastened in a "hook and snap" action by hooking end 30a about pivot pin 36 and snapping end 30b over latch pin 38 (FIG. 5). The clip 30 can be easily unfastened and pivoted out of the way, or removed from pin 36, for insertion or removal of a BGA device.

Figure 7:
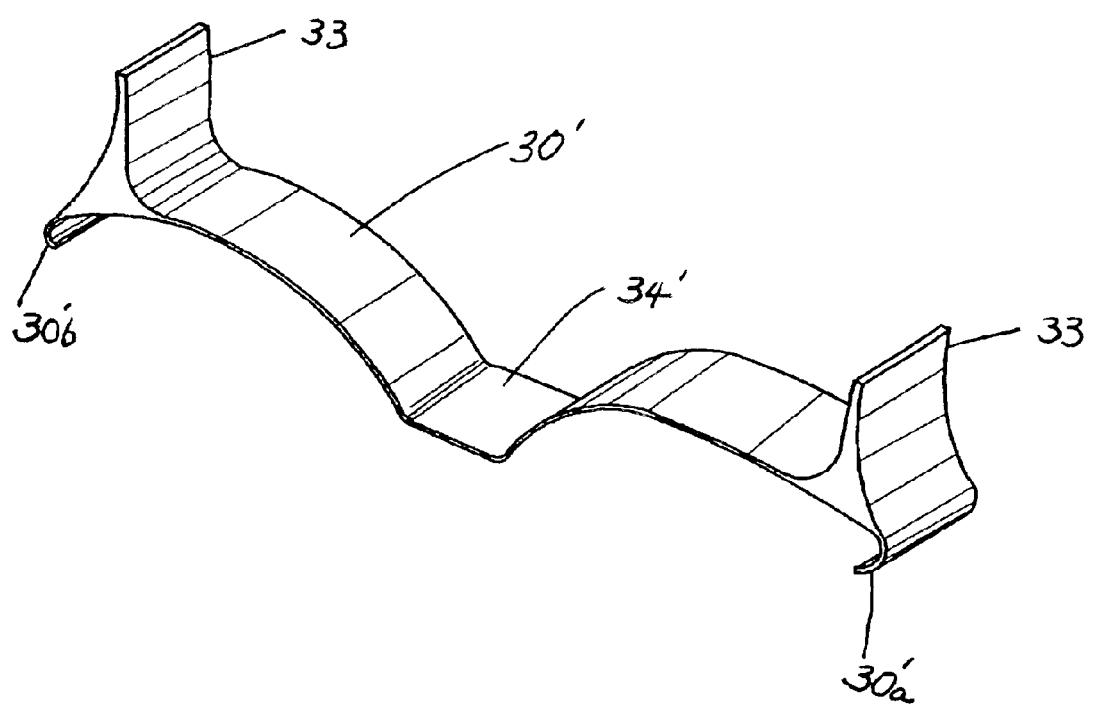
FIG. 7 is a perspective view of another retaining element for retaining a ball grid array device on a test casement according to the invention.

FIG. 7 illustrates another embodiment of a retainer in the form of a clip 30' having a first end 30'a and a second end 30'b. A pressure pad 34' asserts pressure to hold the BGA device in place, and is connected to the ends by two spring sections 32'a and 32'b. In this embodiment, the retainer is easily installed to retain a BGA device by snapping ends 30'a and 30'b over pins 36, 38, respectively using finger tabs 33. The retainer may be removed by snapping the ends off of the pins.

Figure 3:
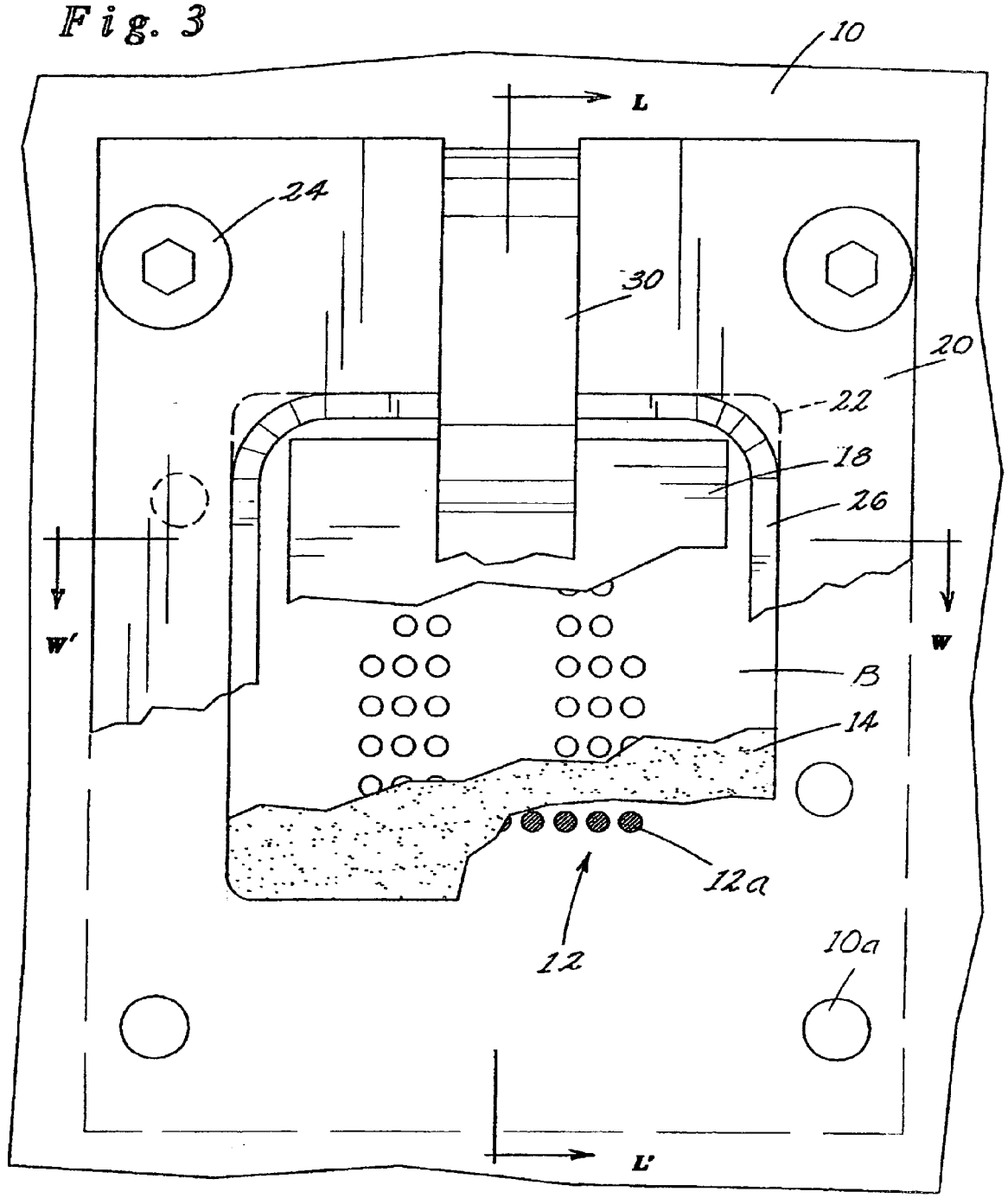
FIG. 3 is a cut-away top plan view to show the components of the assembly shown in FIG. 1.

FIG. 3 provides a cut-away view of the assembly of FIG. 1, illustrating the components of the assembly viewed from above. The casement 20 is secured to DUT board 10 by fasteners 24. A spring clip 30 securely holds a BGA device 18 in an opening or aperture 26 in casement 20. While the drawing is not to scale, aperture 26 is preferably sized to have length and width dimensions that at least slightly exceed the length and width dimensions of the BGA device 18. In this manner, the aperture 26 and casement 20 securely hold the BGA device 18 for testing purposes, while at the same time providing a certain amount of tolerance. That is, a BGA device the physical dimensions of which vary slightly from ideal will not be rejected based solely on its dimensions. Also, as described, the cutting process for the devices may result in a device having approximately the correct physical dimensions, but may have resulted in the ball grid array being slightly skewed or displaced with respect to the device as a whole. These slight variances will not prevent the device from being electrically tested when using the assembly according to the current invention. It will be understood that the aperture 26 can be sized both to ensure (1) that such slight variances will not prevent or interfere with testing and that (2) devices that vary too much in physical dimensions will be appropriately rejected.

FIG. 3 shows a ball alignment plate B fitted into a recess 22 (illustrated here by dashed lines) in casement 20. Because ball alignment plate B is fixed in position by the recess in casement 20, and casement 20 is in turn appropriately positioned on DUT board 10, the ball alignment plate B will act to accurately position the ball grid array of BGA device 18 with respect to the test circuit. Underlying the ball alignment plate B in FIG. 3 is connector pad 14. It will be understood that connector pad 14 is the same size, with respect to its length and width, as ball alignment plate B. Advantageously, both ball alignment plate B and connector pad C are received in recess 22, as can best be seen in FIGS. 4 and 5. In this case, the casement recess acts like a clamp holding the plate and pad clamped like a sandwich. Preferably, the combined thickness of the plate and pad is slightly greater than the depth of recess 22, by a distance "d" (FIG. 5), to assure sufficient compressed contact between the connector balls and test connectors. For example, the recess depth may be 0.026" and the combined depth may be 0.027". In limited applications it may be advantageous to provide a single, larger connector pad covering the entire surface of the DUT board 10. Connector pad 14 provides a desirable resilience and elasticity serving to ensure a secure connection while providing a cushioning effect with respect to the pressure exerted by clip 30. Under connector pad 14 as shown in FIG. 3 is a test circuit 12, illustrating the electrical connections used to test the BGA device 18.

Figure 2:
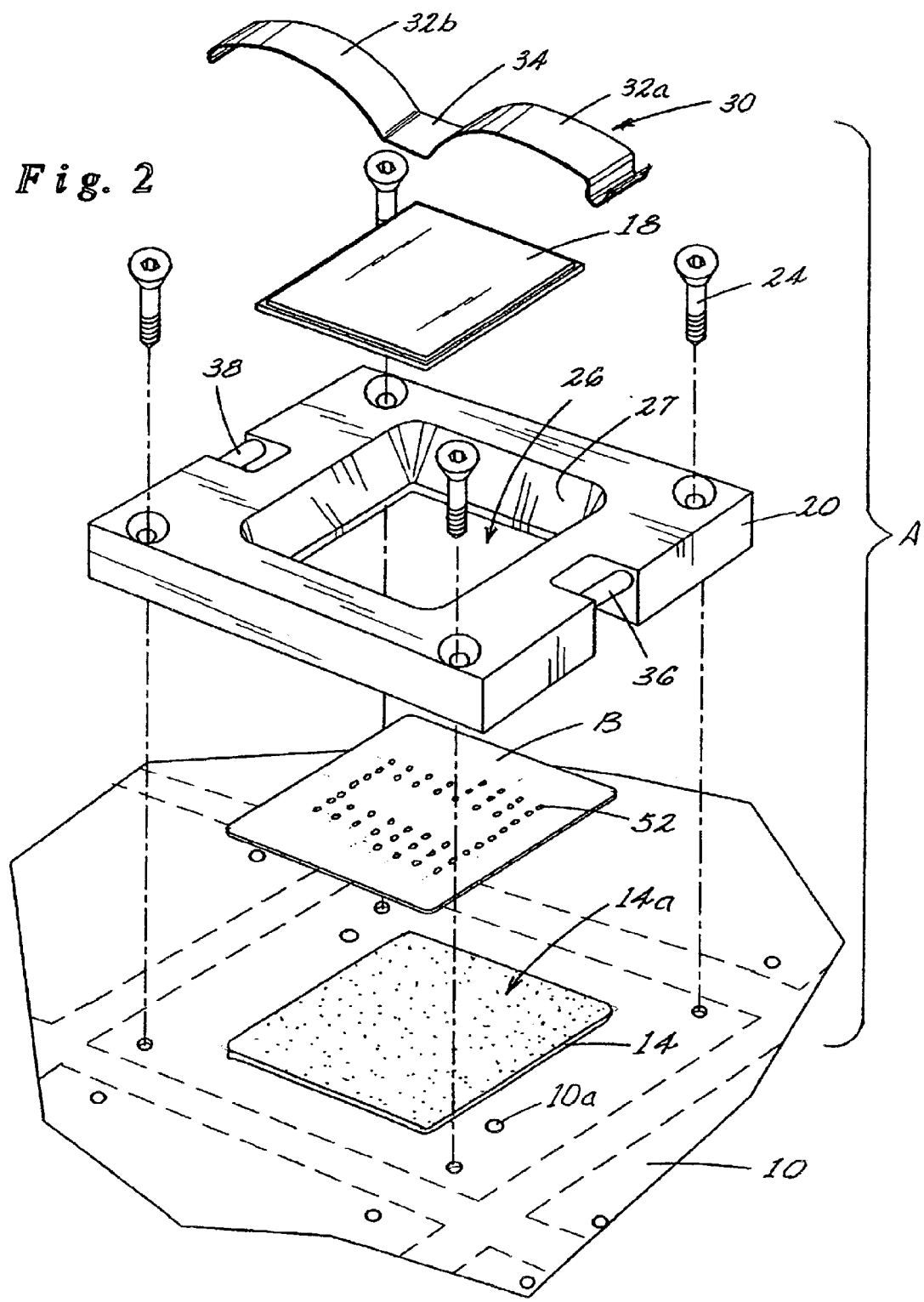
FIG. 2 is an exploded view of the assembly shown in FIG. 1.
Figure 4:
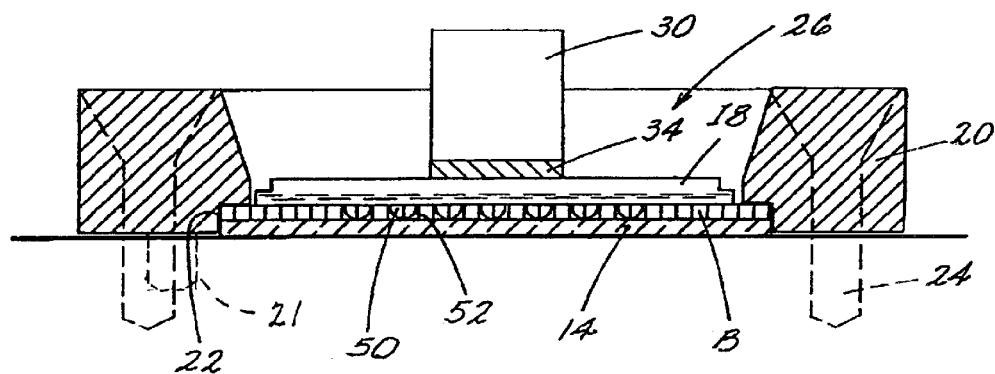
FIG. 4 is a cross-sectional view of the assembly of FIG. 1 along the line X–X'.

FIG. 4 is a cross-sectional view of the casement assembly shown in FIGS. 1–3, the cross-section in this figure being a view along the line W–W' in FIG. 3. Like elements are shown by like numbers. Flat pad 34 of clip 30 is shown securely pressing BGA device 18 against ball alignment plate B. This pressure ensures that each ball 50 in the ball grid array of BGA device 18 will fit securely against the appropriate hole 52 in ball alignment plate B such that each ball is in secure electrical contact with connecter pad 14. It will be noted that it is not necessary that holes 52 be sized to allow the entirety of balls 50 to fit within and through the holes. Holes 52 are preferably sized such that the balls will fit partially into and through the holes, and some allowance is made for balls that are not ideally spherical. Also, FIG. 4 more clearly shows the recess 22 into which ball alignment plate B and connector pad C are seated in casement 20.

FIG. 5 is another cross-sectional view of the assembly of FIGS. 1–3, in this illustration the cross-sectional view being that taken along line L–L' in FIG. 3. Clip 30 is shown in more detail here, having two arcuate portions 32a and 32b joined by a flat pad 34. As described, clip 30 may be a single integral piece of selected material such as spring steel, or may be constructed in parts or segments. Arcuate portions 32a and 32b, and the material of which clip 30 is made, are selected such that an appropriate amount of pressure is exerted on BGA device 18 when clip 30 is closed. Clip 30 may be conveniently attached to casement 20 by a hinge 36 at one end of clip 30. A pin 38 at the opposite end or side of casement 20 allows clip 30 to be locked into position for securing and testing BGA device 18. The pin 38 provides a simple "snap-lock" method of securing the clip 30, enabling the clip 30 to be easily and quickly opened and closed. The structure of clip 30 has the advantage that it provides a secure, yet resilient force downwardly on BGA device 18 to secure device 18 in place and provide sufficient pressure to ensure that the balls of the ball grid array of device 18 stay seated in the holes of ball alignment plate B and extend through the holes to securely contact connector pad 14. Moreover the structure of clip 30 as shown will ensure that at all times, that is, as clip 30 is pivoted downwardly toward its closed position, as it pivoted upwardly to an open position, and while it is in the closed position, the only force exerted on BGA device 18 is in a downward direction. This ensures that there is no horizontal force component exerted by clip 30, which horizontal force might otherwise tend to displace BGA device 18 from ball alignment plate B.

Figure 6A:
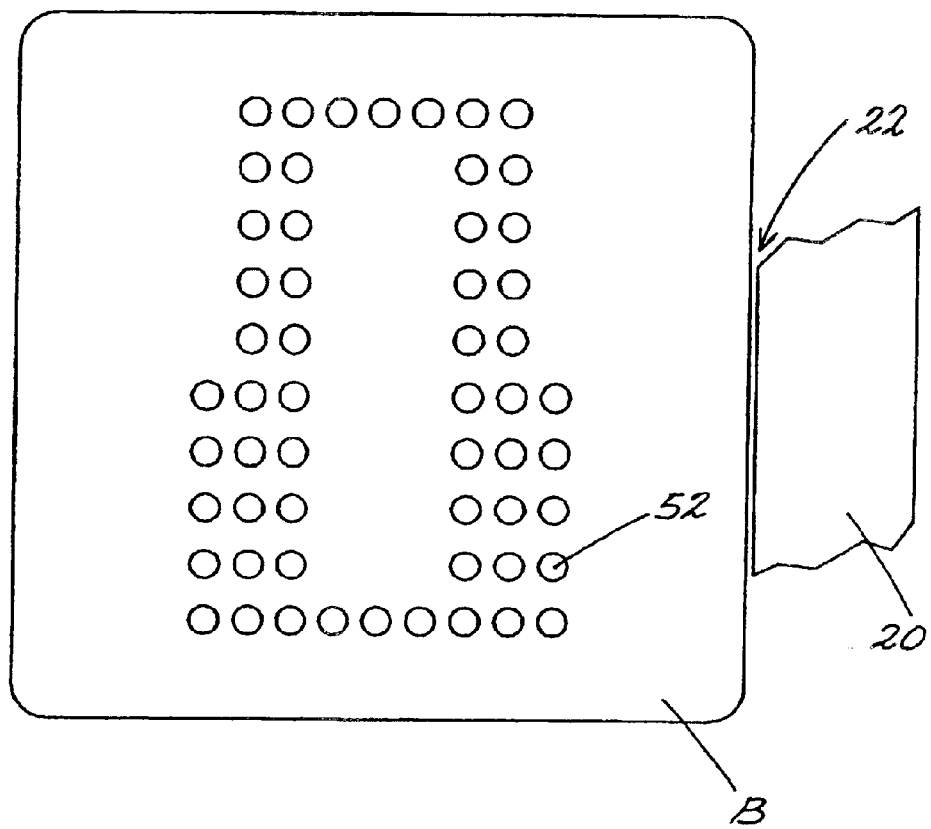
FIGS. 6a & 6b is a view showing certain features of a BGA device and one component of the current invention.
Figure 6B:
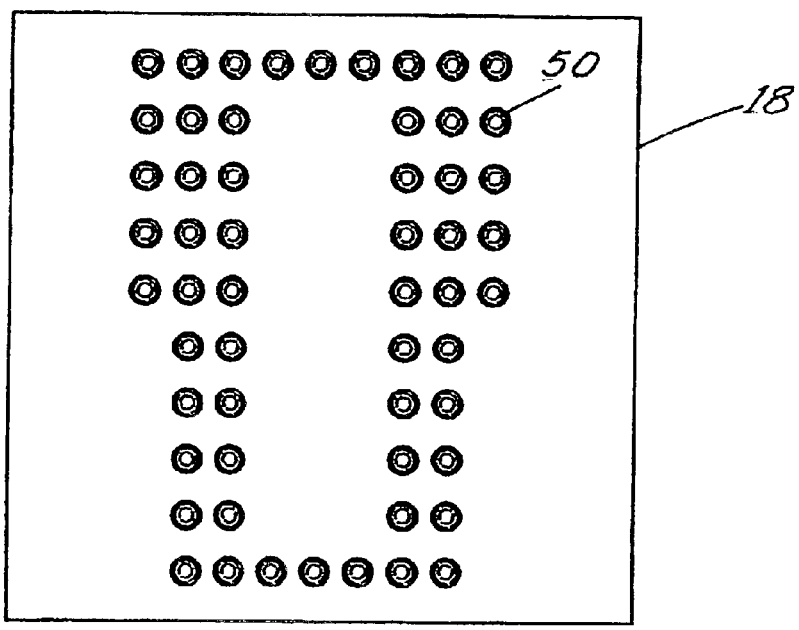

FIGS. 6A and 6B show the matching patterns of a ball alignment plate B (FIG. 6A) and a ball grid array (FIG. 6B) in a mirror image depiction. For illustration purposes, FIG. 6A also shows the recess 22 in casement 20 in which ball alignment plate B is secured. FIG. 6A shows a pattern of a plurality of holes 52 as determined by the pattern of balls 50 in a ball grid array shown in FIG. 6B. As noted, it has been discovered that an appropriate material may be precisely machined to create a ball alignment plate B that will accurately position a BGA device with respect to connectors, the preferred use being for testing purposes.

In its most preferred embodiment, a ball alignment plate will be created to exactly match the pattern of balls in the ball grid array for the specific device being tested. While this will require creating a new plate for each different device, the costs of creating new plates is low. This is especially true because the same casements may be used for different devices, so long as the devices are of at least the same approximate size. For this purpose, the casement can be made up to ½" per side larger to accommodate many different sizes of BGA devices. Using an alignment plate specifically patterned for a given BGA device will ensure accurate positioning for the device, because the device will fit on the plate only when the patterns are exactly matched. Although the ball alignment plate is thin, it will still provide a tactile indication that the device is appropriately seated on the plate. The ball alignment plate can also be created for exclusive patterns for certain manufacturers. It may be possible in some instances to create an alignment plate that can be used for more than one device if the respective arrays for the devices permit.

Also, the use of the ball alignment plate disclosed herein is not necessarily limited to testing. Using appropriate templates, a ball alignment plate may be created to cover a portion or the entirety of a circuit board to which more than one BGA device will be attached. The template will permit a plurality of hole patterns to be formed in the plate, each pattern corresponding to the BGA device to be attached in the correct place on the board. The patterns will then ensure both the proper placement of each device and will assist in holding the devices in place until heat is applied to form the connections between the separate arrays and the circuit board.

An advantage of using the ball alignment plate, and the assembly including the ball alignment plate, is ease of adapting a casing to accommodate a different BGA device, and at a lower cost. In the art as currently practiced, the casing used to test a particular device is specific to that device, that is, the casing for a first type of BGA device is not adapted to allow testing on a different type device. The casings currently used are adapted for the specific ball grid array pattern on the chip. When production is switched to a different device having a different ball grid array pattern, the casings used for the previous device cannot be used. Thus, when production and testing moves to a new or different BGA device, the testing facility (usually the manufacturer) must buy and install an entire set of new casings. Casings are very expensive and represent a significant cost in testing.

Thus, it can be seen that a highly advantageous construction can be had according to the invention wherein a ball alignment plate and assembly as disclosed herein permits the quick, easy, and inexpensive possibility of adapting casings to a new BGA device. Instead of requiring an entirely new casing, use of the current invention requires only the purchase or manufacture of a new set of ball alignment plates. The new plates will be manufactured with a pattern of holes matching the ball grid array pattern of the new device. So long as the new BGA device has approximately the same ball pattern or spacing and ball count less than or equal to the plate, the existing alignment plate can be used with the new BGA device. In some instances, a new substrate circuit device will be required, while other substrates have more universal sets of contacts and can be re-used.

While the assembly has been described above with respect to the essentials thereof, other components may be included to improve performance.

While a preferred embodiment of the invention has been described using specific terms, such description is for illustrative purposes only, and it is to be understood that changes and variations may be made without departing from the spirit or scope of the following claims.

What is claimed is:

1. A testing assembly for testing an electronic ball grid array (BGA) device having an electrical ball connector pattern wherein said BGA device is tested on a test circuit board which includes at least one test circuit having a test connection pattern corresponding to the ball connector pattern of said BGA device, wherein said assembly comprises:
   a test circuit board having at least one test circuit with a plurality of terminal contacts;
   a conductive connector pad generally overlying said test circuit to make electrical contact with said terminal contacts of said test circuit;
   said conductive connector pad having a thickness defined by an upper conductive surface and a lower conductive surface, and said connector pad composed of conductive material so that said connector pad is conductive across its entire thickness;
   a test casement secured to said circuit board in a test position above said connector pad and said test circuit;
   a ball alignment plate carried by said casement overlying said connector pad and test circuit having a ball hole pattern corresponding to said ball connector pattern of said BGA device;
   said test casement having a casement opening through which said ball alignment plate is exposed overlying said connector pad and test circuit;
   a releasable retainer carried by said test casement for retaining said BGA device on said test casement so that said ball connector pattern of said BGA device is retained in contact with said conductive pad and in alignment with said ball hole pattern of said ball alignment plate for testing;
   whereby said BGA device circuit is aligned in electrical connection with said test circuit through said conductive pad for reliable testing of said BGA device.

2. The assembly of claim 1 wherein said casement includes a peripheral inner wall defining an open area for said casement opening, and wherein said open area is slightly greater than outer dimensions of said BGA device so that said BGA device may be maneuvered sufficiently within said open area to align with the hole pattern of the ball alignment plate regardless of variations in the outer dimensions of said BGA device.

3. The assembly of claim 2 wherein said test casement includes an underside facing said connector pad, and a recess formed in said underside having a depth corresponding generally to the thickness of said ball alignment plate, and said ball alignment plate being retained in said casement recess during testing.

4. The assembly of claim 1 wherein said ball alignment plate comprises a sheet of non-static high glass plastic with said ball hole pattern including a plurality holes formed through said plastic material.

5. The assembly of claim 1 wherein said ball alignment plate has a thickness of from about 0.001 to about 0.03 inches, depending on the size of the connector balls of said BGA device being tested.

6. The assembly according to claim 5 wherein inner dimensions of said central opening are greater than outer dimensions of said BGA device.

7. The assembly of claim 1 wherein said test casement includes an underside facing said connector pad, and a recess formed in said underside for receiving said ball alignment plate, and said ball alignment plate being retained in said casement recess during testing.

8. The assembly of claim 7 wherein said ball alignment plate and said connector pad are received in said casement recess, with said connector pad generally coextending with said ball alignment plate.

9. The assembly of claim 8 wherein a combined uncompressed thickness of said ball alignment plate and said connector pad is slightly greater than a depth of said recess.

10. The assembly of claim 1 wherein said retainer includes a releasable retainer element spanning said central opening having a pressure pad pressing said BGA device against said ball alignment plate thereby pressing said ball connector pattern against said conductor pad and test circuit.

11. The assembly of claim 10 wherein said retainer element includes a removable spring clip having a first end connected to said casement on one side of said central opening and a second end connected to said casement on an opposite side of said central opening, said pressure pad including a horizontal pressure plate carried between said ends of said spring clip.

12. The assembly of claim 10 wherein casement includes complimentary latch elements disposed on opposing sides of said casement opening cooperating with respective first and second ends of said retaining element to fasten said retaining element in place.

13. In an electronic circuit testing assembly for testing the circuit of a ball grid array (BGA) device, said assembly being of the type having an electrical ball connection pattern, a test circuit having a corresponding test connector pattern including a plurality of terminal contacts, a conductive pad disposed between said BGA device and said test circuit, and a fixture for holding said BGA device and said conductor pad in superposed contact alignment with said test circuit wherein said assembly comprises;
   a ball alignment plate of thin material having a hole pattern formed through said alignment plate matching the ball connector pattern of said BGA device;
   said ball alignment plate positioned adjacent said test circuit board when held by said fixture so that said hole pattern is aligned with said terminal contacts of said test connector pattern of said test circuit; and
   said hole pattern facilitating accurate alignment of said ball connector pattern of said BGA device and said test connector pattern of said test circuit so that said BGA device is electrically aligned with said test circuit and said connector pad permits electrical contact between said BGA device and said plurality of terminal contacts of said test circuit board for reliable testing of said BGA device.

14. The assembly of claim 13 wherein said ball alignment plate comprises a sheet of non-static high glass plastic, and said hole pattern includes a plurality of holes formed through said plastic sheet.

15. The assembly of claim 13 wherein said ball alignment plate has a thickness of from about 0.001 to about 0.03 inches, depending on the ball diameter and pattern size.

16. The assembly of claim 13 wherein said fixture includes a test casement for secured to said circuit board in a test position above said connector pad and said test circuit; said casement having a peripheral wall defining a casement opening, and wherein said casement opening has an area slightly larger than the dimensions of said BGA device so that said BGA device may be maneuvered sufficiently within said casement opening to align precisely with the hole pattern of the ball alignment plate, regardless of variations in the outer dimensions of said BGA device.

17. The assembly of claim 16 wherein said test casement includes an underside facing said connector pad during testing, a recess formed in said underside, and said ball alignment plate being retained in said recess during testing.

18. The assembly of claim 17 wherein said ball alignment plate and said connector pad are received in said casement recess and said ball alignment plate said casement opening has an area slightly larger than said ball alignment plate.

19. The assembly of claim 18 wherein a combined uncompressed thickness of said ball alignment plate and said connector pad is slightly greater than a depth of said recess.

20. An assembly for testing a ball grid array (BGA) device, said assembly comprising:

a circuit board having at least one test circuit with an array of electrical terminal contacts arranged in a test connector pattern for electrically contacting an array of ball contacts of a ball connector pattern of said BGA device;

a casement for temporarily holding BGA devices of varying outer dimensions in electrical connection with said electrical terminal contacts of said test circuit, said casement having a top and a bottom, said casement mounted to said circuit board such that said bottom is adjacent said circuit board, and said casement having a casement opening therethrough and a recess formed around the casement opening in said casement bottom;

a ball alignment plate mounted in said casement recess, said ball alignment plate comprising a relatively thin sheet having a hole pattern formed through the sheet, said hole pattern matching the ball connector pattern of said BGA device;

said casement opening having inner dimensions greater than outer dimensions of said BGA device so that said BGA may be maneuvered within said casement opening to reliably position said BGA device in electrical alignment with said test circuit regardless of variations in the outer dimensions of said BGA device, and a retainer for releasably securing a BGA device in said casement opening in electrical contact with said test circuit;

an electrically conductive resilient connector pad located between said ball alignment plate and said circuit board and in electrical contact with a plurality of terminal contacts of said test circuit;

whereby said hole pattern of said ball alignment plate positions said ball contacts of said BGA device in operable electrical contact with said electrical contacts of said test circuit for reliable testing of said BGA device.

21. The assembly according to claim 20 further comprising means for resiliently urging said BGA device against said circuit board.

22. The assembly of claim 20 wherein said ball alignment plate and said connector pad are received in said casement recess.

23. The assembly of claim 22 wherein a combined uncompressed thickness of said ball alignment plate and said connector pad is slightly greater than a depth of said recess.

24. The assembly of claim 20 wherein said retainer includes a releasable retainer element spanning said central opening having a pressure pad pressing said BGA device against said ball alignment plate thereby pressing said ball connector pattern against said conductor pad and test circuit.

25. The assembly of claim 24 wherein said retainer element includes a removable spring clip having a first end connected to said casement on one side of said central opening and a second end connected to said casement on an opposite side of said central opening, said pressure pad including a horizontal pressure plate carried between said ends of said spring clip.

26. The assembly of claim 24 wherein casement includes complimentary latch elements disposed on opposing sides of said casement opening cooperating with respective first and second ends of said retaining element to fasten said retaining element in place.

27. A method of testing the electronic circuit of a ball grid array (BGA) device having a ball contacts arranged in a ball connector pattern, said method being of the type wherein the BGA device is placed in a casement secured to a circuit board having a test circuit and the casement includes a casement opening fixed directly over the test circuit, the casement opening having inner dimensions equal to the outer dimensions of the BGA device so to automatically align the ball contacts of the BGA device electrically with the connectors contacts of a test circuit disposed below the BGA device, wherein the method comprises:

providing a test casement having a casement opening with inner dimensions slightly greater that the outer dimensions of said BGA device;

fixing said test casement to the test circuit board directly over a test circuit; fixing a conductive pad to overly a plurality of terminal contacts of the test circuit on said casement; fixing a thin ball alignment plate over said conductive pad wherein the ball alignment plate has a plurality of holes therethrough arranged in a hole pattern matching the ball connector pattern of the BGA device and the test connector pattern of the test circuit;

placing said BGA device within said casement opening and on said ball alignment plate; and moving the BGA device over the ball alignment plate within the casement opening until said ball connector align and fit within the holes of said ball alignment plate;

whereby BGA devices may be reliably electrically aligned with the test circuit regardless of variations in the outer dimensions of said BGA devices.

* * * * *